(12) United States Patent
Liu et al.

(10) Patent No.: US 8,737,084 B2
(45) Date of Patent: May 27, 2014

(54) PRINTED CIRCUIT BOARD AND CARRIER

(75) Inventors: Yu-Ching Liu, New Taipei (TW); Chi-An Yu, New Taipei (TW); Zhi-Jun Wang, Shenzhen (CN); Hai-Yang Niu, Shenzhen (CN); Yong Tan, Shenzhen (CN); Ri-Qing Chen, Shenzhen (CN); Ling-Lin Yuan, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 149 days.

(21) Appl. No.: 13/285,019

(22) Filed: Oct. 31, 2011

(65) Prior Publication Data

US 2012/0236512 A1    Sep. 20, 2012

(30) Foreign Application Priority Data

Mar. 15, 2011  (CN) .......................... 2011 1 0061998
Jun. 1, 2011   (CN) .......................... 2011 1 0145724

(51) Int. Cl.
*H05K 5/00*      (2006.01)

(52) U.S. Cl.
USPC ........... 361/759; 361/732; 361/740; 361/742; 361/801

(58) Field of Classification Search
USPC ......... 361/801–804, 127, 125, 725–732, 747, 361/736, 740–742, 752, 754, 756, 758–760, 361/770, 796, 798, 807–810, 825; 439/347, 439/342, 372, 75; 292/127, 129; 174/250
See application file for complete search history.

(56) References Cited

U.S. PATENT DOCUMENTS

| | | | | |
|---|---|---|---|---|
| 4,280,029 A * | 7/1981 | Lewis | ......................... | 200/50.01 |
| 4,821,393 A | 4/1989 | Spigarelli | | |
| 5,216,581 A * | 6/1993 | Fisher et al. | ................... | 361/728 |
| 6,134,116 A * | 10/2000 | Hoss et al. | ..................... | 361/747 |
| 6,235,991 B1 * | 5/2001 | Johnson | ...................... | 174/70 R |
| 6,424,540 B1 * | 7/2002 | Chen et al. | ..................... | 361/759 |
| 6,813,161 B2 * | 11/2004 | Le et al. | ........................ | 361/758 |
| 6,967,850 B2 * | 11/2005 | Barr et al. | ..................... | 361/802 |
| 7,539,021 B2 * | 5/2009 | Peng | ............................. | 361/759 |
| 8,174,837 B2 * | 5/2012 | Tracy et al. | .................... | 361/747 |
| 8,258,134 B2 * | 9/2012 | Berthel et al. | ................ | 514/247 |
| 8,329,509 B2 * | 12/2012 | Gong et al. | .................... | 438/112 |
| 2003/0231478 A1 * | 12/2003 | Luoma et al. | ................. | 361/810 |
| 2007/0279884 A1 * | 12/2007 | Hardt et al. | .................... | 361/796 |
| 2010/0265671 A1 * | 10/2010 | Tsai et al. | ..................... | 361/749 |

FOREIGN PATENT DOCUMENTS

CN        201134975 Y    10/2008
CN        201274611 Y    7/2009

* cited by examiner

*Primary Examiner* — Lisa Lea Edmonds
*Assistant Examiner* — Christopher L Augustin
(74) *Attorney, Agent, or Firm* — Novak Druce Connolly Bove + Quigg LLP

(57) ABSTRACT

A printed circuit board (PCB) secured to a carrier, the carrier comprising at least one hook for securing the PCB, the PCB includes a first surface and a second surface opposite to the first surface. At least one recessed portion in the rim of the first surface receives at least one hook so there are no protrusions above the upper surface of the PCB. A carrier for securing the PCB is also provided.

4 Claims, 6 Drawing Sheets

PRINTED CIRCUIT BOARD AND CARRIER

BACKGROUND

1. Technical Field

The present disclosure relates to printed circuit boards (PCB) and carriers for securing the PCBs.

2. Description of Related Art

Many printed circuit boards are manufactured to use Surface Mount Technology (SMT) in the mounting of components. Generally, an SMT PCB requires operators to secure the PCB to a carrier manually, by, for example, sticking the PCB to the carrier by glue, which results in low efficiency and high cost.

BRIEF DESCRIPTION OF THE DRAWINGS

The components of the drawings are not necessarily drawn to scale, the emphasis instead being placed upon clearly illustrating the principles of a printed circuit board. Moreover, in the drawings, like reference numerals designate corresponding parts throughout several views.

DETAILED DESCRIPTION

Figure 1:
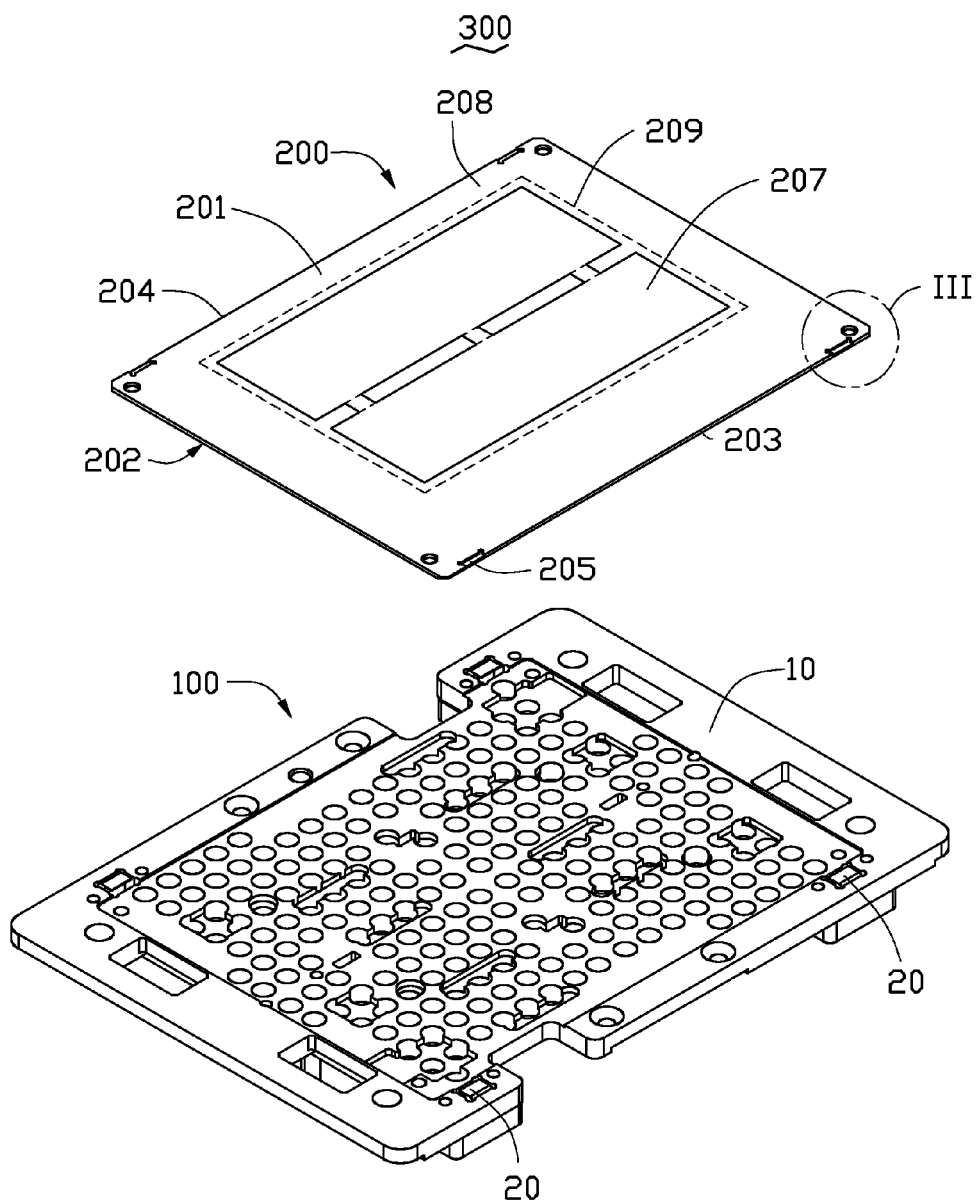
FIG. 1 is an isometric view showing a PCB and a carrier for securing the PCB, in accordance with an embodiment.

Referring to FIG. 1, a circuit board fixing system 300 is illustrated in an embodiment. The system 300 is to secure a PCB 200 where the PCB has been manufactured for the surface mount process in relation to components. The system 300 includes the PCB 200 and a carrier 100 to secure the PCB 200.

Figure 2:
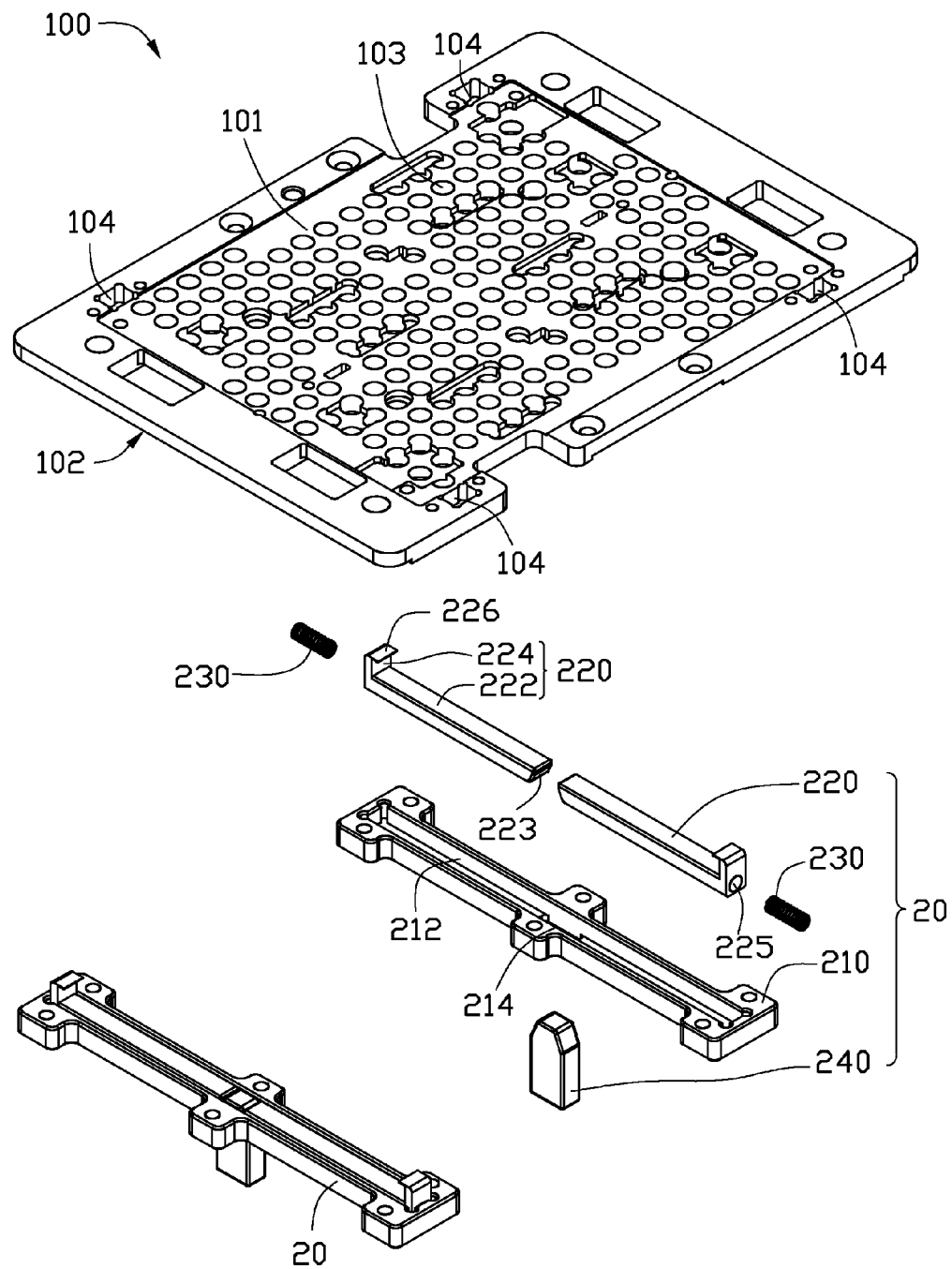
FIG. 2 is an exploded, isometric view of the carrier of FIG. 1.

Referring also to FIG. 2, the carrier 100 includes a support element 10 to support the PCB 200 and a pair of latching assemblies 20 arranged on the support element 10 to secure the PCB 200 to the support element 10. The PCB 200 is substantially rectangular. The support element 10 includes a first surface 101 and a second surface 102 opposite to the first surface 101. The first surface 101 is in contact with the PCB 200 when the PCB 200 is secured to the carrier 100. In this embodiment, the first surface 101 defines a number of heat pass-through holes 103 to allow radiated heat to pass through and disperse during the surface mounting process. The support element 10 defines four through holes 104. Each of the through holes 104 is arranged in close proximity to a corner of the first surface 101. In this embodiment, the through holes 104 themselves are substantially rectangular.

Each latching assembly 20 includes a sliding rail 210, a pair of hook members 220 slidably connected to the sliding rail 210, a pair of elastic elements 230, and a beveled operating member 240.

The sliding rail 210 is secured to the second surface 102. The sliding rail 210 defines a longitudinal sliding slot 212. The middle of the sliding rail 210 defines an opening 214 communicating with the sliding slot 212 to receive the operating member 240.

The hook members 220 are slidably received in the sliding slot 212. The total combined length of the two hook members 220 is less than that of the sliding slot 212. Each hook member 220 includes a sliding portion 222 slidably received in the sliding slot 212 and a hook portion 224 at an end of the sliding portion 222. The other end of the sliding portion 222 (opposite to the hook portion 224) defines a guiding surface 223. The guiding surface 223 is inclined so as to match the beveling of the operating member 240. When the two hook members 220 are close together, the two guiding surfaces 223 cooperatively form a substantially V-shaped recess. Each hook portion 224 passes through one through hole 104 and the distal end of the hook portion 224 protrudes out of the first surface 101. The distal end of the hook portion 224 includes a hook 226 parallel to the sliding portion 222. In this embodiment, the two hooks 226 face each other. Each hook 226 cooperates with the first surface 101 to form a gap 228 (see FIG. 4) to clip the PCB 200 in place.

One end of each elastic element 230 abuts the hooked end of the sliding portion 222, and the other end is manipulated against an end of the sliding slot 212, to provide an elastic force pressing the hook members 220 towards each other. In this embodiment, the hooked end of the sliding portion 222 defines a receiving hole 225 to receive one end of the elastic element 230.

The operating member 240 is received in the opening 214 and the guiding surfaces 223 function so as to drive the hook members 220 away from each other when the operating member 240 is pressed between them. In this embodiment, the inner end of the operable member 240 is tapered in profile to match the two guiding surfaces 223.

The PCB 200 maybe a single PCB unit or several PCB units (PCB units 207). In the embodiment, the PCB 200 includes a number of PCB units 207 arranged in parallel, and a frame 208 surrounding the PCB units 207. Each of the PCB units 207 includes electronic elements (not shown) thereon. The portion between one PCB unit 207 and an adjacent PCB unit 207, and the portion between a PCB unit 207 and the frame 208 define a plurality of cut lines 209, such that each of the PCB units 207 may be easily detached from the PCB 200 after the assembling process.

Figure 3:
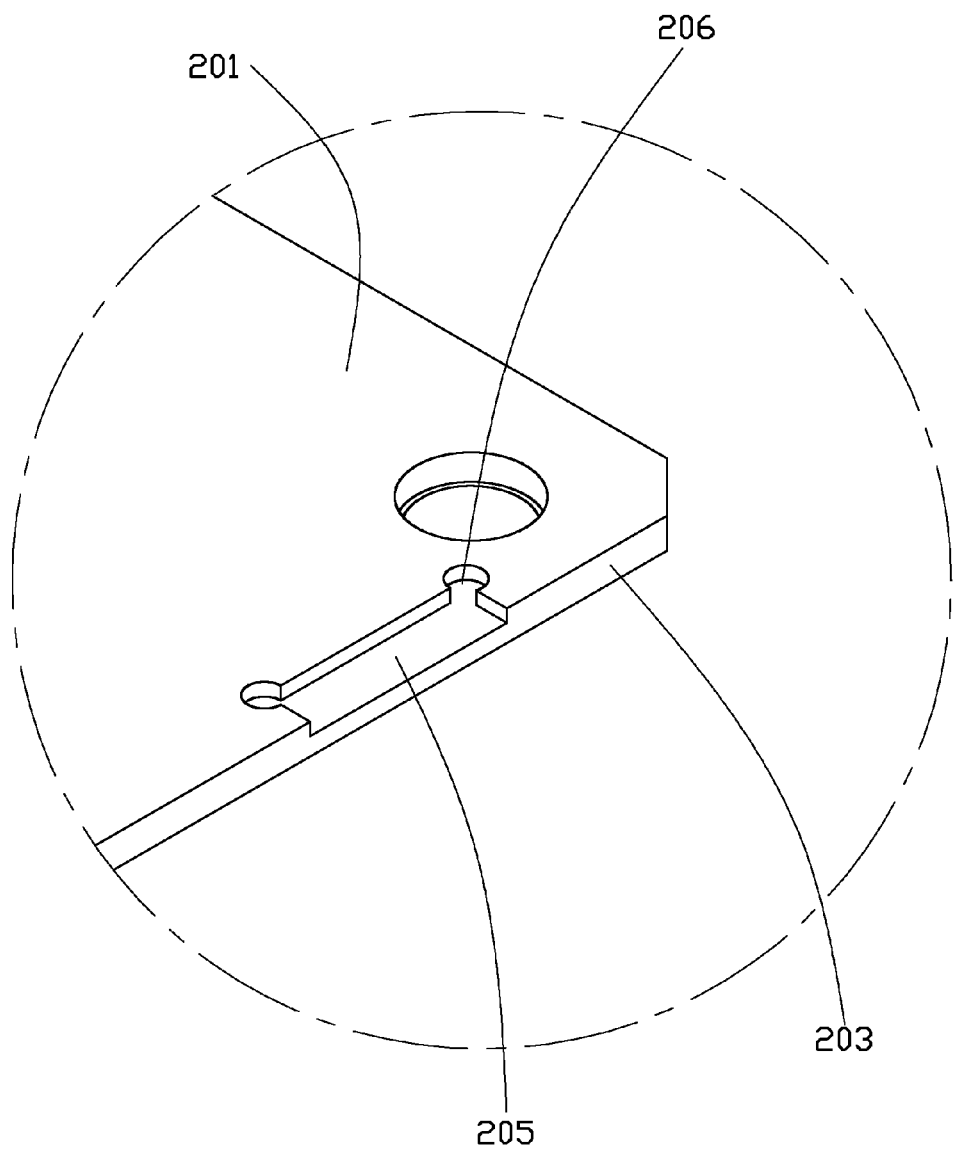
FIG. 3 is an enlarged view of portion III of FIG. 1.

Referring to FIG. 1 and FIG. 3, the PCB 200 is substantially rectangular. The PCB 200 includes a first surface 201, a second surface 202 opposite to the first surface 201, a first sidewall 203, and a second sidewall 204 opposite to the first sidewall 204. Four recessed portions 205 are formed in the first surface 201. Each recessed portion 205 extends halfway from the first surface 201 to the second surface 202 and creates a small void in an upper portion of the first sidewall 203 and of the second sidewall 204. Each recessed portion 205 corresponds to one hook 226. The recessed portion 205 is substantially rectangular to receive the corresponding hook 226 and the depth of each recessed portion 205 avoids the hooks 226 protruding from the first surface 201 of the PCB 200. In this embodiment, the hooks 226 are coplanar with the first surface 201 when the hooks 226 are received in the recessed portions 205.

Each recessed portion 205 further includes two recesses 206. The two recesses 206 are found at the inner corners of each recessed portion 205. The recesses 206 in the embodiment are symmetrical to each other. The recesses 206 are used for making allowances for various angles of the hook 226, to prevent the hook 226 protruding from the first surface 201 when a sidewall of a PCB 200 is irregular or when other geometry requires the oblique attachment of a latching assembly 20.

Figure 4:
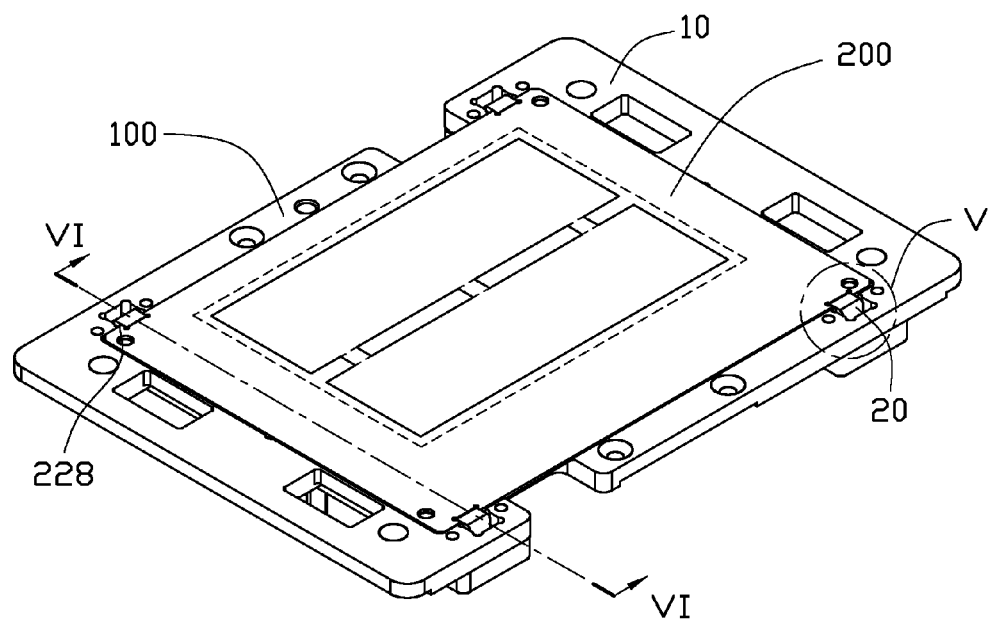
FIG. 4 is an isometric view showing the PCB secured to the carrier.
Figure 5:
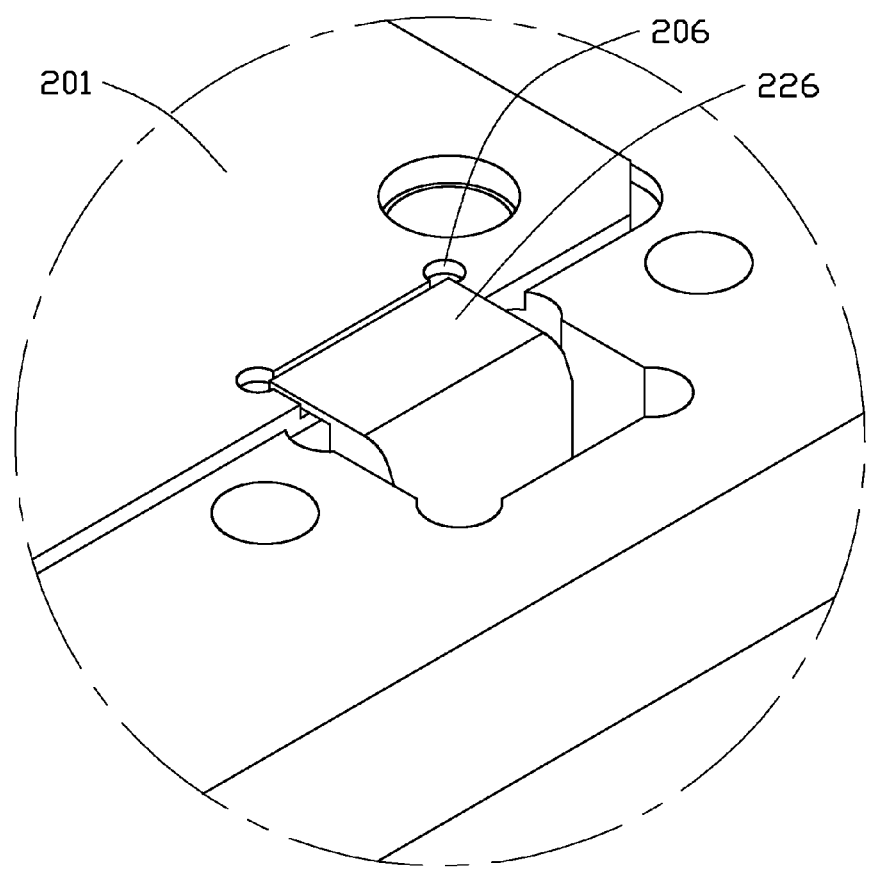
FIG. 5 is an enlarged view of portion V of FIG. 4.
Figure 6:
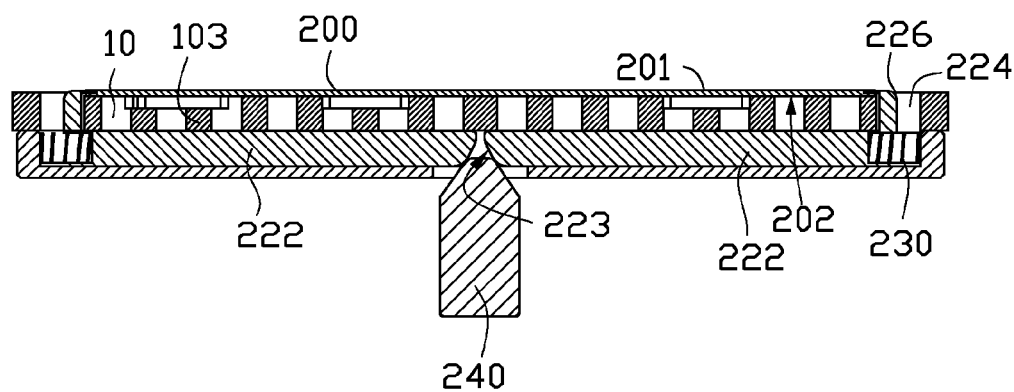
FIG. 6 is a cross-sectional view taken along line VI-VI of FIG. 4.

Referring to FIGS. 4-6, to secure the PCB 200 to the carrier 100: the operating member 240 is pushed towards the second surface 102, the hook members 220 slide away from each other to allow the opposite sides of the PCB 200 to be clipped in the clearance 228. At this time, the elastic elements 230 are under pressure and elastically deform, thus, when the operating member 240 is released, the elastic elements 230 push the hook members 220 together, and the PCB 200 is secured to the carrier 100 as the hook members 220 latch in the recessed portions 205. Additionally, as the hook members 220 are capable of sliding, the uncompressed distance between the hooks 226 is changeable for various PCBs 200 of different lengths.

Thus the PCB 200 is conveniently and easily secured to the carrier 100 without glue. Furthermore, by virtue of the recessed portions 205 receiving the hooks 226 and an absence of any protrusion from the first surface 201, abnormalities and problems are avoided in the surface mounting process of the PCB 200.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A carrier for securing a printed circuit board (PCB), the carrier comprising:

a supporting element comprising a first surface for supporting the PCB; and at least one locking mechanism secured to the supporting element, the at least one locking mechanism comprising two hook members, the two hook members slidably secured to the supporting element and capable of sliding toward and away from each other;

wherein two hooks respectively extend from each hook members and face each other, the hooks cooperate with the first surface to form a clearance for clipping the PCB.

2. The carrier of claim 1, further comprising a sliding rail, wherein the sliding rail is fixed to the supporting element and defines a sliding slot for slidably receiving the two hook members.

3. The carrier of claim 2, further comprising two elastic elements, wherein the two elastic elements respectively abut the two hook members for providing an elastic force to drive the hook members sliding toward each other.

4. The carrier of claim 3, further comprising an operating member, wherein the operating member is arranged between the hook members and is operated to drive the two hook members to slide away from each other.

* * * * *